United States Patent
Park et al.

(10) Patent No.: US 10,185,013 B2
(45) Date of Patent: Jan. 22, 2019

(54) MAGNETIC RESONANCE IMAGING (MRI) APPARATUS AND METHOD OF GENERATING MR IMAGE

(71) Applicants: SAMSUNG ELECTRONICS CO., LTD., Suwon-si (KR); KOREA ADVANCED INSTITUTE OF SCIENCE AND TECHNOLOGY, Daejeon (KR)

(72) Inventors: Hyun-wook Park, Daejeon (KR); Hyun-seok Seo, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 334 days.

(21) Appl. No.: 15/079,671

(22) Filed: Mar. 24, 2016

(65) Prior Publication Data
US 2016/0282437 A1    Sep. 29, 2016

(30) Foreign Application Priority Data
Mar. 24, 2015  (KR) ........................ 10-2015-0040964

(51) Int. Cl.
*G01R 33/483* (2006.01)
*G01R 33/561* (2006.01)

(52) U.S. Cl.
CPC ..... *G01R 33/5614* (2013.01); *G01R 33/4835* (2013.01)

(58) Field of Classification Search
None
See application file for complete search history.

(56) References Cited

U.S. PATENT DOCUMENTS

| 4,769,603 A | 9/1988 | Oppelt et al. |
| 6,369,569 B1 | 4/2002 | Heid |

(Continued)

FOREIGN PATENT DOCUMENTS

| JP | 2000-217801 A | 8/2000 |
| JP | 201178574 A | 4/2011 |
| KR | 1020130025343 A | 3/2013 |

OTHER PUBLICATIONS

Communication dated Jul. 1, 2016 issued by the Korean Intellectual Property Office in counterpart Korean Patent Application No. 10-2015-0040964.

(Continued)

*Primary Examiner* — Paresh H Patel
(74) *Attorney, Agent, or Firm* — Sughrue Mion, PLLC

(57) ABSTRACT

Provided is a magnetic resonance imaging (MRI) apparatus for generating an MR image based on a steady state free procession (SSFP) sequence. The MRI apparatus includes: a radio frequency (RF) controller configured to apply to an object a first RF pulse corresponding to a first slice and a second RF pulse corresponding to a second slice; a gradient magnetic field controller configured to control respective gradient magnetic fields in a first direction corresponding to the first and second RF pulses, from among spatial encoding gradients, to have opposite polarities with respect to each other; a data acquisition unit configured to acquire first and second MR signals corresponding to the first and second slices; and an image processor configured to generate first and second MR images corresponding to the first and second slices, respectively, based on the acquired first and second MR signals.

17 Claims, 12 Drawing Sheets

(56) References Cited

U.S. PATENT DOCUMENTS

| | | |
|---|---|---|
| 7,514,927 B2 | 4/2009 | Herzka et al. |
| 2005/0134274 A1 | 6/2005 | Boskamp |
| 2006/0139027 A1 | 6/2006 | Dreher et al. |
| 2007/0167733 A1 | 7/2007 | Miyoshi |
| 2011/0234223 A1* | 9/2011 | McColl ............ G01R 33/56509 324/309 |
| 2012/0013336 A1* | 1/2012 | Hetzer ............... G01R 33/4818 324/309 |
| 2012/0249114 A1 | 10/2012 | Sako et al. |
| 2013/0057280 A1 | 3/2013 | Feiweier |
| 2014/0043026 A1* | 2/2014 | Frahm ............... G01R 33/4826 324/309 |

OTHER PUBLICATIONS

Brian Hargreaves; "Fast Gradient Echo Sequences Including Balanced SSFP", May 6, 2006, Total 7 pages.

Communication dated Mar. 14, 2016, issued by the Korean Intellectual Property Office in counterpart Korean Application No. 10-2015-0040964.

* cited by examiner

MAGNETIC RESONANCE IMAGING (MRI) APPARATUS AND METHOD OF GENERATING MR IMAGE

CROSS-REFERENCE TO RELATED APPLICATION

This application claims priority from Korean Patent Application No. 10-2015-0040964, filed on Mar. 24, 2015, in the Korean Intellectual Property Office, the disclosure of which is incorporated herein by reference in its entirety.

BACKGROUND

1. Field

Exemplary embodiments relate to magnetic resonance imaging (MRI) apparatuses and methods for acquiring data and generating an MR image based on the acquired data.

2. Description of the Related Art

A magnetic resonance imaging (MRI) apparatus uses a magnetic field to capture an image of a target object. The MRI apparatus is widely used to obtain an accurate disease diagnosis because stereoscopic images of bones, lumbar discs, joints, nerve ligaments, and other body parts may be obtained at desired angles.

However, when MR images are acquired using an MRI apparatus, a relatively long scanning time is required. Furthermore, since a long MR image acquisition time may cause distortions due to movements caused by heartbeat, breathing, and other peristaltic movements, it may be difficult to obtain a high quality image. Thus, an apparatus and method that are capable of shortening image acquisition time and reducing image distortions are needed.

SUMMARY

Provided are magnetic resonance imaging (MRI) apparatuses and methods for acquiring data and generating an MR image based on the acquired data.

Additional aspects will be set forth in part in the description which follows and, in part, will be apparent from the description, or may be learned by practice of the presented exemplary embodiments.

According to an aspect of one or more exemplary embodiments, an MRI apparatus for generating an MR image based on a steady state free precession (SSFP) sequence includes: a radio frequency (RF) controller configured to apply, to an object, a first RF pulse that corresponds to a first slice and a second RF pulse that corresponds to a second slice; a gradient magnetic field controller configured to control a first gradient magnetic field in a first direction in correspondence with the first RF pulse and a second gradient magnetic field in the first direction in correspondence with the second RF pulse, from among spatial encoding gradients, to have opposite polarities with respect to each other; a data acquirer configured to acquire a first MR signal that corresponds to the first slice and a second MR signal that corresponds to the second slice; and an image processor configured to generate a first MR image that corresponds to the first slice based on the acquired first MR signal, and to generate a second MR image that corresponds to the second slice based on the acquired second MR signal.

The spatial encoding gradients may include a slice selection gradient, a frequency encoding gradient, and a phase encoding gradient, and the first direction may be a direction in which the frequency encoding gradient is applied.

The first and second gradient magnetic fields may be bipolar gradient magnetic fields, each having first and second polarities, and the gradient magnetic field controller may control, when the first gradient magnetic field sequentially has the first and second polarities, the second gradient magnetic field to sequentially have second and first polarities.

The gradient magnetic field controller may control a respective magnitude of each of the first and second gradient magnetic fields.

The gradient magnetic field controller may apply a third gradient magnetic field after applying the first gradient magnetic field, and apply a fourth gradient magnetic field after applying the second gradient magnetic field.

The data acquirer may acquire the first MR signal while the first gradient magnetic field is being applied and acquire the second MR signal while the second gradient magnetic field is being applied.

The image processor may correct each of the first MR signal and the second MR signal based on a magnetic field distribution of a coil included in the MRI apparatus.

The gradient magnetic field controller may control a sum of moments of gradient magnetic fields applied during a repetition time TR to be equal to a preset value.

According to an aspect of one or more exemplary embodiments, a method for generating an MR image based on a SSFP sequence via an MRI apparatus includes: applying, to an object, a first RF pulse that corresponds to a first slice and a second RF pulse that corresponds to a second slice; controlling a first gradient magnetic field in a first direction in correspondence with the first RF pulse and a second gradient magnetic field in the first direction in correspondence with the second RF pulse, from among spatial encoding gradients, to have opposite polarities with respect to each other; acquiring a first MR signal that corresponds to the first slice and a second MR signal that corresponds to the second slice; and generating a first MR image that corresponds to the first slice based on the acquired first MR signal and a second MR image that corresponds to the second slice based on the acquired second MR signal.

The spatial encoding gradients may include a slice selection gradient, a frequency encoding gradient, and a phase encoding gradient, and the first direction may be a direction in which the frequency encoding gradient is applied.

The first and second gradient magnetic fields may be bipolar gradient magnetic fields, each having positive and negative polarities, and the controlling of the first and second gradient magnetic fields to have opposite polarities may include controlling the first and second gradient magnetic fields to sequentially have the opposite polarities.

The method may further include controlling a magnitude of each of the first and second gradient magnetic fields.

The controlling of the magnitude of each of the first and second gradient magnetic fields may include: applying a third gradient magnetic field after applying the first gradient magnetic field; and applying a fourth gradient magnetic field after applying the second gradient magnetic field.

The acquiring of the first and second MR signals may include: acquiring the first MR signal while the first gradient magnetic field is being applied; and acquiring the second MR signal while the second gradient magnetic field is being applied.

The generating of the first and second MR images may include correcting each of the first MR signal and the second MR signal based on a magnetic field distribution of a coil included in the MRI apparatus.

The method may further include controlling a sum of moments of gradients applied during a repetition time TR to be equal to a preset value.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Figure 1:
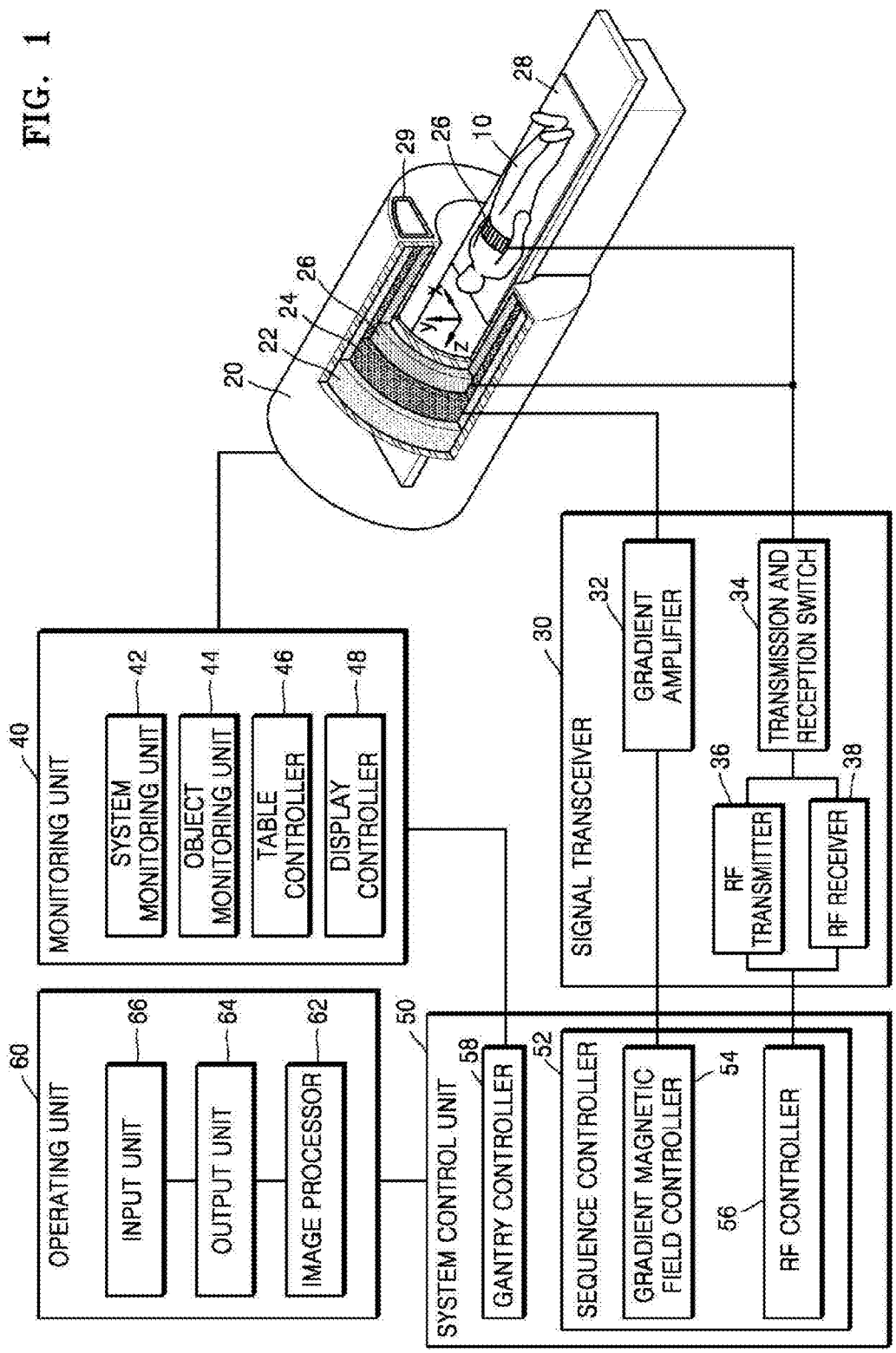
FIG. 1 is a block diagram of a general magnetic resonance imaging (MRI) system.

Hereinafter, the terms used in the specification will be briefly described, and then the exemplary embodiments will be described in detail.

The terms used in this specification are those general terms currently widely used in the art in consideration of functions regarding the exemplary embodiments, but the terms may vary according to the intention of those of ordinary skill in the art, precedents, or new technology in the art. Also, some terms may be arbitrarily selected by the applicant, and in this case, the meaning of the selected terms will be described in detail in the detailed description of the present specification. Thus, the terms used in the specification should be understood not as simple names but based on the meaning of the terms and the overall description of the exemplary embodiments. Expressions such as "at least one of," when preceding a list of elements, modify the entire list of elements and do not modify the individual elements of the list.

When a part "includes" or "comprises" an element, unless there is a particular description contrary thereto, the part can further include other elements, not excluding the other elements. In addition, terms such as " . . . unit", " . . . module", or the like refer to units that perform at least one function or operation, and the units may be implemented as hardware or software or as a combination of hardware and software.

Throughout the specification, an "image" may mean multi-dimensional data formed of discrete image elements, e.g., pixels in a two-dimensional (2D) image and voxels in a three-dimensional (3D) image. For example, an image may be a medical image of an object acquired by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom means a material having a density, an effective atomic number, and a volume that are approximately the same as those of an organism. For example, the phantom may be a spherical phantom having properties similar to the human body.

Furthermore, in the present specification, a "Magnetic Resonance Imaging (MRI)" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient magnetic field, an MR signal, or the like as a function of time.

Furthermore, in the present specification, "repetition time TR" may be a time between repetitions of an RF pulse. For example, the repetition time TR may be defined as a time interval from a point of time when an RF pulse with a predetermined magnitude is transmitted to a point of time when an RF pulse with the same magnitude is transmitted again.

Furthermore, in the specification, "time to echo (TE)" may be defined as a time interval from a point of time when an RF pulse is transmitted to a point of time when its MR signal is acquired.

Furthermore, in the specification, "spatial encoding" may mean acquisition of spatial information along an axis (direction) of a gradient magnetic field by applying a linear gradient magnetic field that induces extra dephasing of proton spins, in addition to dephasing of proton spins caused by an RF signal.

An MRI apparatus is an apparatus for acquiring a sectional image of a part of an object by expressing, in a contrast comparison, a strength of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI apparatus may receive the MR signal and acquire an MR image.

The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI apparatuses include characteristics different from those of other imaging apparatuses. Unlike imaging apparatuses such as CT apparatuses that acquire images based on a direction of detection hardware, MRI apparatuses may acquire 2D images or 3D volume images that are oriented toward an optional point. MRI apparatuses do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

Reference will now be made in detail to exemplary embodiments, examples of which are illustrated in the accompanying drawings. In this regard, the present exemplary embodiments may have different forms and should not be construed as being limited to the descriptions set forth herein. In addition, parts not related to the present inventive concept are omitted to clarify the description of the exemplary embodiments. Like reference numerals refer to like elements throughout. FIG. 1 is a block diagram of a general MRI system.

Referring to FIG. 1, the general MRI system may include a gantry 20, a signal transceiver 30, a monitoring unit (also referred to herein as a "monitor") 40, a system control unit (also referred to herein as a "system controller") 50, and an operating unit (also referred to herein as an "operator") 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-axis, Y-axis, and Z-axis directions which cross each other at right angles. The gradient coil 24 may provide location information of each region of the object 10 by variably inducing resonance frequencies based on the regions of the object 10.

The RF coil 26 may emit an RF signal toward a patient and receive an MR signal emitted from the patient. In detail, the RF coil 26 may transmit, toward atomic nuclei and having precessional motion, an RF signal having the same frequency as that of the precessional motion to the patient, stop transmitting the RF signal, and then receive an MR signal emitted from the patient.

For example, in order to transit an atomic nucleus from a low energy state to a high energy state, the RF coil 26 may generate and apply, to the object 10, an electromagnetic wave signal that is an RF signal which corresponds to a type of the atomic nucleus. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Larmor frequency. In this aspect, when the applying of the electromagnetic wave signal to the atomic nucleus is discontinued, an energy level of the atomic nucleus is changed from a high energy level to a low energy level, and thus the atomic nucleus may emit electromagnetic waves having a Larmor frequency. The RF coil 26 may receive electromagnetic wave signals from atomic nuclei included in the object 10.

The RF coil 26 may be realized as one RF transmitting and receiving coil that has both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil which is designed for a specific part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil according to structures.

The RF coil 26 may be a transmission exclusive coil, a reception exclusive coil, or a transmission and reception coil according to methods of transmitting and receiving an RF signal.

The RF coil 26 may be an RF coil that has various numbers of channels, such as 16 channels, 32 channels, 72 channels, and/or 144 channels.

Hereinafter, it is assumed that the RF coil 26 is a RF multi-coil that includes N coils which respectively correspond to a plurality of channels, i.e., first through N-th channels. In this case, an RF multi-coil may also be referred to as a multi-channel RF coil.

The gantry 20 may further include a display 29 disposed outside the gantry 20 and a display (not shown) disposed inside the gantry 20. The gantry 20 may provide predetermined information to the user or the object 10 via the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-axis, Y-axis, and Z-axis directions may be synthesized.

The RF transmitter 36 and the RF receiver 38 may drive the RF coil 26. The RF transmitter 36 may supply an RF pulse in a Larmor frequency to the RF coil 26, and the RF receiver 38 may receive an MR signal received by the RF coil 26.

The transmission and reception switch 34 may adjust transmitting and receiving directions of the RF signal and the MR signal.

For example, the transmission and reception switch 34 may emit the RF signal toward the object 10 via the RF coil 26 during a transmission mode, and receive the MR signal from the object 10 via the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit (also referred to herein as a "system monitor") 42, an object monitoring unit (also referred to herein as an "object monitor") 44, a table controller 46, and a display controller 48.

The system monitoring unit 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and/or a state of a compressor.

The object monitoring unit 44 monitors a state of the object 10. In detail, the object monitoring unit 44 may include a camera for observing a movement or position of the object 10, a respiration measurer for measuring the respiration of the object 10, an electrocardiogram (ECG) measurer for measuring the electrical activity of the object 10, and/or a temperature measurer for measuring a temperature of the object 10.

The table controller 46 controls a movement of the table 28 upon which the object 10 is positioned.

The table controller 46 may control the movement of the table 28 based on a sequence control of a sequence controller 52. For example, during moving imaging of the object 10, the table controller 46 may continuously or discontinuously move the table 28 based on the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Further, when a speaker is located inside or outside the gantry 20, the display controller 48 may control the speaker to be on or off, or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 based on a pulse sequence received from the operating unit 60. In particular, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI system.

The operating unit 60 may include an image processor 62 for receiving and processing the MR signal received by the RF receiver 38, an output unit (also referred to herein as an "output device") 64, and an input unit (also referred to herein as an "input device") 66.

The image processor 62 may process the MR signal received from the RF receiver 38 so as to generate MR image data of the object 10.

The image processor 62 receives the MR signal received by the RF receiver 38 and performs any one of various signal processes, such as amplification, frequency transformation, phase detection, low frequency amplification, and/or filtering, with respect to the received MR signal.

For example, the image processor 62 may arrange digital data in a k-space of a memory, and rearrange the digital data into image data via a two-dimensional (2D) or three-dimensional (3D) Fourier Transform.

The image processor 62 may perform a composition process or difference calculation process on image data if required. The composition process may include an addition process on a pixel or a maximum intensity projection (MIP) process. The image processor 62 may store not only the rearranged image data but also image data upon which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 may output image data generated or rearranged by the image processor 62 to the user. The output unit 64 may also output information required for the user to manipulate the MRI system, such as a user interface (UI), user information, and/or object information. Examples of the output units 64 may include any one or more of a speaker, a printer, a cathode ray tube (CRT) display, a liquid crystal display (LCD), a plasma display panel (PDP), an organic light emitting diode (OLED) display, a field emission display (FED), a light emitting diode (LED) display, a vacuum fluorescent display (VFD), a digital light processing (DLP) display, a flat panel display (PFD), a three-dimensional (3D) display, a transparent display, and other various output devices that are well known to one of ordinary skill in the art.

The user may input object information, parameter information, a scan condition, a pulse sequence, or information about image composition or difference calculation by using the input unit 66. The input unit 66 may include any one or more of a keyboard, a mouse, a track ball, a voice recognizer, a gesture recognizer, a touch screen, or any one of other various input devices that are well known to one of ordinary skill in the art.

The signal transceiver 30, the monitoring unit 40, the system control unit 50, and the operating unit 60 are separate components in FIG. 1, but it will be apparent to one of ordinary skill in the art that respective functions of the signal transceiver 30, the monitoring unit 40, the system control unit 50, and the operating unit 60 may be performed by another component.

For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI system may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, and/or any of other various communication methods that are well known to one of ordinary skill in the art.

Figure 2:
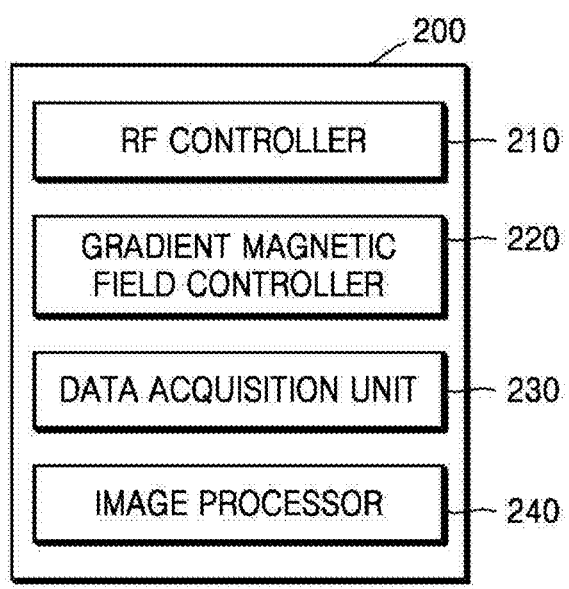
FIG. 2 illustrates a configuration of an MRI apparatus, according to an exemplary embodiment.

FIG. 2 illustrates a configuration of an MRI apparatus 200, according to an exemplary embodiment.

The MRI apparatus 200 may be any image processing apparatus that is configured for reconstructing an MR image by using an MR signal acquired during MR imaging. Furthermore, the MRI apparatus 200 may include a magnetic computing device for controlling acquisition of MR signals during MR imaging.

Referring to FIG. 2, the MRI apparatus 200 according to the exemplary embodiment may include an RF controller 210, a gradient magnetic field controller 220, a data acquisition unit (also referred to herein as a "data acquirer") 230, and an image processor 240.

In detail, the MRI apparatus 200 may be included in the MRI system of FIG. 1. In this case, the RF controller 210, the gradient magnetic field controller 220, the data acquisition unit 230, and the image processor 240 of the MRI apparatus 200 may respectively correspond to the RF controller 56, the gradient magnetic field controller 54, the RF receiver 38 or the signal transceiver 30 including the RF receiver 38, and the image processor 62 as described above with reference to FIG. 1.

Furthermore, the MRI apparatus 200 may be connected to the MRI system of FIG. 1 to be operated and may include a computing device for controlling an MRI scan performed by the MRI system. In particular, the MRI apparatus 200 may be connected to the RF coil 26 and the gradient coil 24 in the MRI system by wire or wirelessly. Furthermore, the RF controller 210 of the MRI apparatus 200 may control an operation of the RF controller 56 described with reference to FIG. 1, and the gradient magnetic field controller 220 may control an operation of the gradient magnetic field controller 54 as described above with reference to FIG. 1.

The data acquisition unit 230 may receive an MR signal via the RF receiver 38 as described above with reference to FIG. 1.

The RF controller 210 may control an RF coil (not shown) that corresponds to the RF coil 26.

According to an exemplary embodiment, the RF controller 210 may alternately apply a plurality of RF pulses which respectively correspond to a plurality of slices to an object. In this case, a slice may be a unit region of the object from which an MR signal is acquired in order to generate an MR image. For example, the MRI apparatus 200 may apply a first RF pulse that corresponds to a first slice and a second RF pulse that corresponds to a second slice to the object.

According to an exemplary embodiment, the RF controller 210 may apply a plurality of RF pulses to the object at intervals of repetition time TR that are shorter than relaxation time T2, and the data acquisition unit 230 may acquire an MR signal in a steady state. In this aspect, the relaxation time T2 may be the time range from the time at which an RF pulse is transmitted to the time at which transverse magnetization of spins of the atomic nuclei decays to about 37% of its initial value. The repetition time TR may be the time range from the time at which an RF pulse having a predetermined magnitude is transmitted to the time at which an RF pulse having the same magnitude is transmitted again.

Figure 3A:
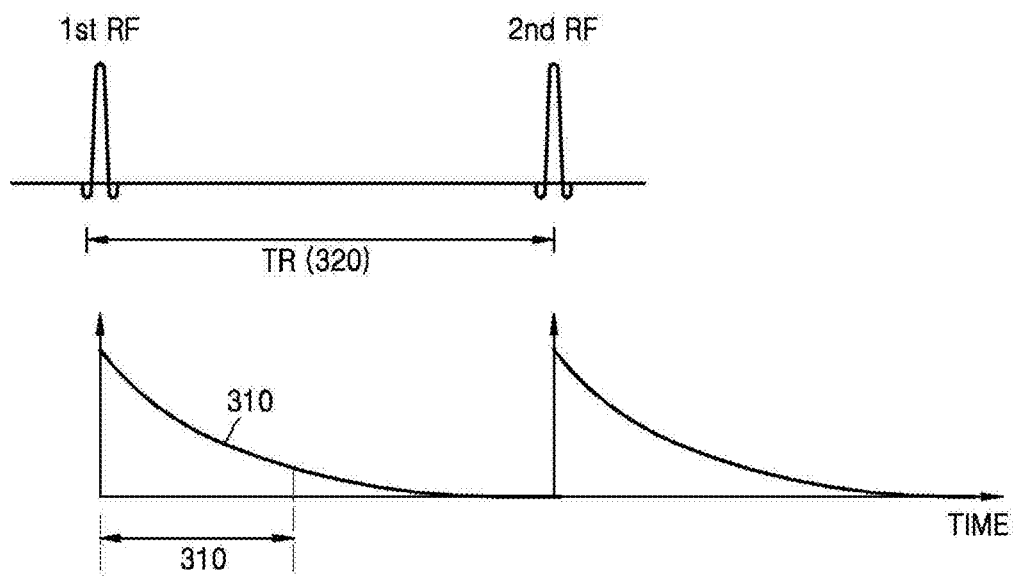
FIGS. 3A and 3B are diagrams for explaining a steady state.
Figure 3B:
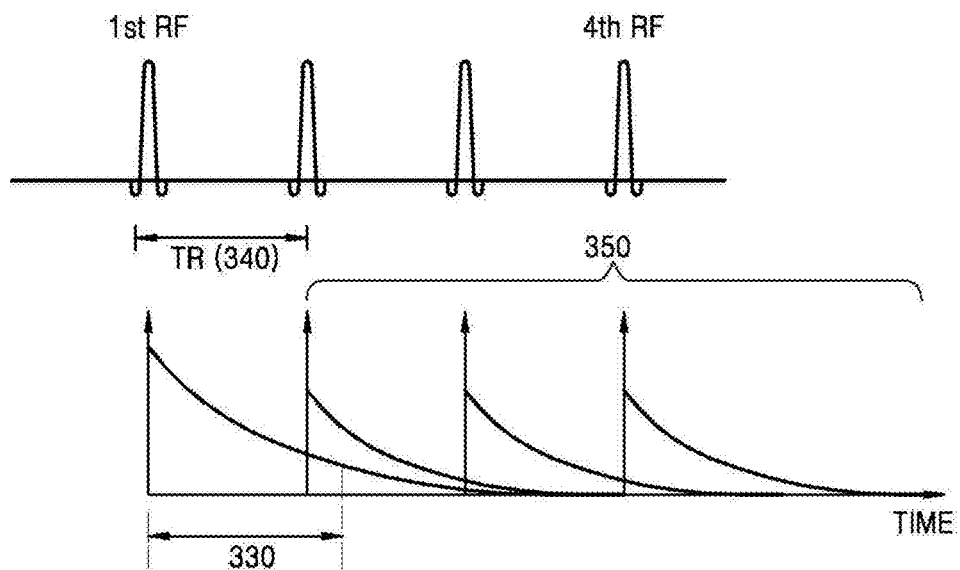

FIGS. 3A and 3B are diagrams for explaining a steady state. In this aspect, the steady state may be a state in which transverse magnetization of spins of atomic nuclei to which electromagnetic waves have been applied does not completely decay but partially remains.

Referring to FIGS. 3A and 3B, the steady state may occur according to a relation between relaxation time T2 310 and repetition time TR 320 of atomic nuclei.

For example, as shown in FIG. 3A, in case the RF controller 210 applies RF pulses to an object at intervals of the repetition time TR 320 that are longer than the relaxation time T2 310, when a second RF pulse is applied to the object, transverse magnetization having the same magnitude as one produced by a first RF pulse may be produced.

However, in case the RF controller 210 applies RF pulses to the object at intervals of repetition time TR 340 that are shorter than relaxation time T2 330, a second RF pulse may be applied to an object in a state in which transverse magnetization produced by a first RF pulse does not completely decay. In this case, an MR signal emitted by the first RF pulse may affect an MR signal formed from the second RF pulse. In this way, the transverse magnetization that does not completely decay may keep a certain magnitude as RF pulses are repeatedly applied, and this may be called a steady state 350. The steady state 350 may also be referred to as an equilibrium state or a stationary state.

Furthermore, residual transverse magnetization in a steady state may be combined with transverse magnetization newly generated by a next RF pulse and cause the magnitude of the newly generated transverse magnetization to increase.

Referring back to FIG. 2, the gradient magnetic field controller 220 may control a gradient coil in order to generate spatial encoding gradients. Furthermore, the spatial encoding gradients may include gradient magnetic fields in X-axis, Y-axis, and Z-axis directions. In detail, the spatial encoding gradients may be represented in a 3D K-space, and the gradient magnetic fields in X-, Y-, and Z-axis directions may respectively correspond to gradient magnetic fields along Kx, Ky, and Kz axes. According to an exemplary embodiment, the gradient magnetic fields in X-axis, Y-axis, and Z-axis directions may respectively correspond to a frequency encoding gradient, a phase encoding gradient, and a slice selection gradient. According to an exemplary embodiment, a gradient magnetic field in a frequency encoding direction may correspond to a gradient magnetic field in a Y-axis direction of K-space, i.e., a Ky-axis direction.

When spatial encoding gradients are applied to the object so that different resonant frequencies may be induced according to regions of the object, location information of each of the regions of the object may be obtained. Thus, as spatial encoding gradients are applied to the object, an MR signal, received via the data acquisition unit 230, may include spatial information with respect to the object that can be represented in a 3D coordinate system. Thus, the gradient magnetic field controller 220 may control a gradient coil via which spatial encoding gradients respectively corresponding to a plurality of slices are applied. For example, the gradient magnetic field controller 220 may apply first and second spatial encoding gradients respectively corresponding to first and second slices to the object.

According to an exemplary embodiment, the gradient magnetic field controller 220 may control a gradient coil according to a steady-state free procession (SSFP) technique. The SSFP technique is a technique for obtaining an MR image by using a steady state and may include a gradient sequence for refocusing a dephased MR signal after an RF pulse is transmitted.

According to an exemplary embodiment, the gradient magnetic field controller 220 may control gradient magnetic fields applied to the object in a first direction from among the first and second spatial encoding gradients to have opposite polarities with respect to each other. Hereinafter, a gradient magnetic field applied to the object in a first direction is referred to as a "gradient in a first direction." Having opposite polarities with respect to each other may mean that a gradient in a first direction that corresponds to a first RF pulse has a first polarity (e.g., positive or negative polarity) while a gradient in the first direction that corresponds to a second RF pulse has a second polarity (e.g., a negative polarity if the first polarity is a positive polarity, or a positive polarity if the first polarity is a negative polarity). Furthermore, according to an exemplary embodiment, the first direction may be a frequency encoding direction.

According to an exemplary embodiment, gradients in the first direction respectively corresponding to the first and second RF pulses may be bipolar gradients. For example, a gradient in the first direction that corresponds to each RF pulse may be a bipolar gradient that includes a pre-phasing gradient. If a gradient in the first direction that corresponds to the first RF pulse sequentially has first and second polarities (or second and first polarities), a gradient in the first direction that corresponds to the second RF pulse may sequentially have second and first polarities (or first and second polarities).

Furthermore, to refocus residual transverse magnetization of spins of atomic nuclei that does not completely decay based on a SSFP sequence, the gradient magnetic field controller 220 may control gradients applied to an object in a second direction from among first and second spatial encoding gradients to have opposite directions with respect to each other. In this case, the second direction may be a phase encoding direction.

In this manner, by applying gradients in the first and second directions and having opposite polarities during one repetition time TR, the gradient magnetic field controller 220 may control the sum of moments of gradients applied to the object during one repetition time TR to be constant. For example, the MRI apparatus 200 may control the sum of moments of gradients applied to the object during each repetition time TR to be zero (i.e., 0) or approximately zero. Thus, the gradient magnetic field controller 220 may apply a gradient sequence to the object according to a SSFP or balanced SSFP (bSSFP) technique.

According to an exemplary embodiment, the gradient magnetic field controller 220 may control a magnitude of a gradient applied to the object in a first direction. For example, the gradient magnetic field controller 220 may apply a first gradient in a first direction that corresponds to a first slice and subsequently a first extra gradient (i.e., a third gradient) in the first direction. Furthermore, the gradient magnetic field controller 220 may apply a second gradient in the first direction that corresponds to a second slice and subsequently a second extra gradient (i.e., a fourth gradient) in the first direction. In this case, the first and second extra gradients which respectively correspond to the first and second slices are applied in order to avoid interference between MR signals from different slices. In addition, since the first and second extra gradients have opposite polarities with respect to each other, the sum of moments of gradients applied to the object during one repetition time TR may be held constant.

The data acquisition unit 230 may receive an MR signal emitted from a slice via the RF coil (26 of FIG. 1).

According to an exemplary embodiment, the data acquisition unit 230 may receive MR signals emitted from a plurality of slices during one repetition time TR. In order to receive MR signals from a plurality of slices during one single repetition time TR, the data acquisition unit 230 may sequentially acquire, as different RF pulses that respectively correspond to the plurality of slices are applied by the RF controller 210 during the one repetition time TR, MR signals that respectively correspond to the different RF pulses during the same single repetition time TR.

In this case, MR signals acquired by the data acquisition unit 230 may include a free induction decay (FID) signal and an echo signal. For example, the data acquisition unit 230 may sequentially receive a first FID signal emitted from a first slice and a second FID signal emitted from a second slice during one repetition time TR. Furthermore, the data acquisition unit 230 may receive a first FID signal emitted from the second slice, followed by acquisition of an echo signal emitted from the first slice. When a gradient is applied based on a SSFP sequence, echo signals may be generated at intervals of time to echo TE that is equal to or close to repetition time TR. For example, an echo signal from the first slice and an FID signal from the second slice may overlap each other. Thus, according to an exemplary embodiment, the gradient magnetic field controller 220 may apply first and second extra gradients in the first direction to the object, thereby preventing interference between the echo signal from the first slice and the FID signal from the second slice.

Furthermore, the data acquisition unit 230 may provide an MRI signal received via the RF coil 26 to the image processor 240.

The image processor 240 may generate K-space data by sampling an MR signal provided by the data acquisition unit 230. Furthermore, the image processor 240 may generate an MR image by performing a Fourier transform by which the K-space data is converted from the frequency domain to the spatial domain. For example, the image processor 240 may generate first K-space data that corresponds to a first slice and second K-space data that corresponds to a second slice by sequentially sampling a first MR signal that includes spatial information of the first slice and a second MR signal that includes spatial information of the second slice. Furthermore, the image processor 240 may generate first and second MR images that respectively correspond to the first and second slices based on the first and second K-space data.

Alternatively, the image processor 240 may generate K-space data by undersampling an MR signal received from the data acquisition unit 230. In this case, the image processor 240 may generate an MR image based on undersampled K-space data by using generalized auto-calibrating partially parallel acquisitions (GRAPPA), sensitivity encoding (SENSE), and/or any other suitable technique.

According to an exemplary embodiment, the image processor 240 may correct K-space data based on a magnetic field distribution of a coil included in the MRI apparatus 200 in order to compensate for banding artifacts that may occur due to the use of a SSFP sequence.

In addition, while it has been described that the MRI apparatus 200 generates MR images that respectively correspond to first and second slices, exemplary embodiments are not limited thereto. According to an exemplary embodiment, the MRI apparatus 200 may generate MR images that respectively correspond to a greater number of slices (e.g., multiples of two such as four, six, and eight) during one repetition time TR.

Figure 4:
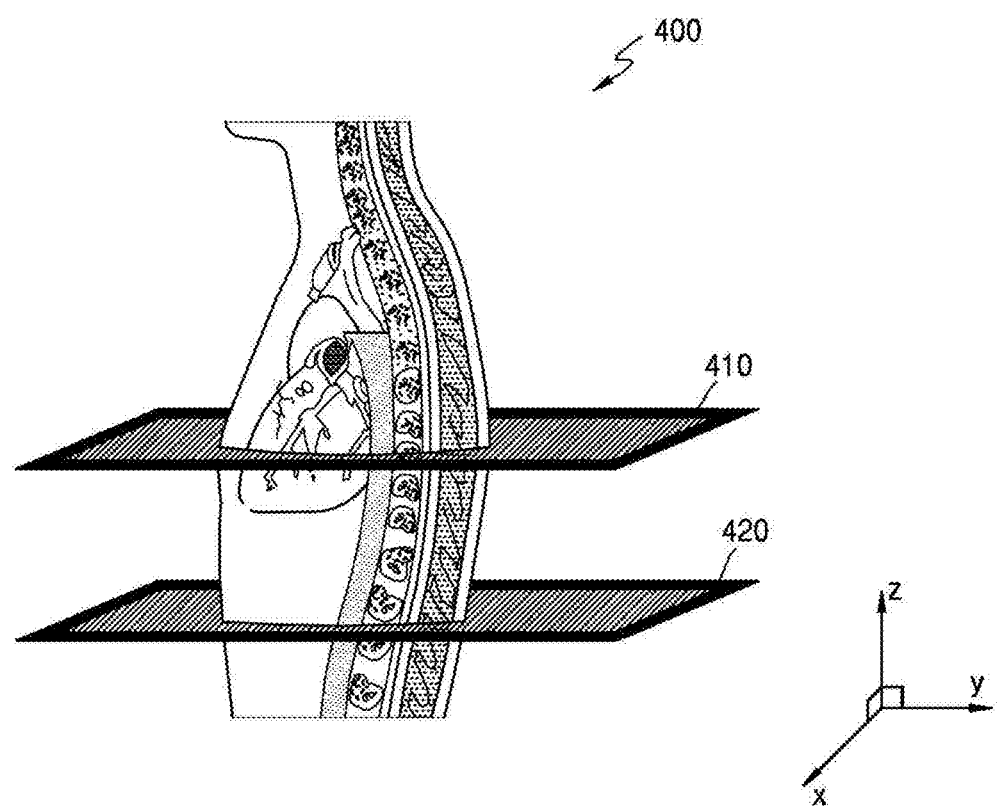
FIG. 4 illustrates a plurality of slices from which MR images are generated by an MRI apparatus.

FIG. 4 illustrates a plurality of slices from which MR images are generated by the MRI apparatus 200.

Referring to FIG. 4, the MRI apparatus 200 may generate MR images that respectively correspond to first and second slices 410 and 420 at discontinuous positions on an object.

According to an exemplary embodiment, the MRI apparatus 200 may acquire MR signals that respectively correspond to the first and second slices 410 and 420 during one repetition time TR by using a SSFP technique. Although FIG. 4 shows that the first and second slices 410 and 420 have a relatively large distance therebetween for convenience of description, the first and second slices 410 and 420 may be adjacent slices from among multiple slices. Furthermore, the first and second slices 410 and 420 may be spaced apart from each other by one slice pitch.

Figure 5:
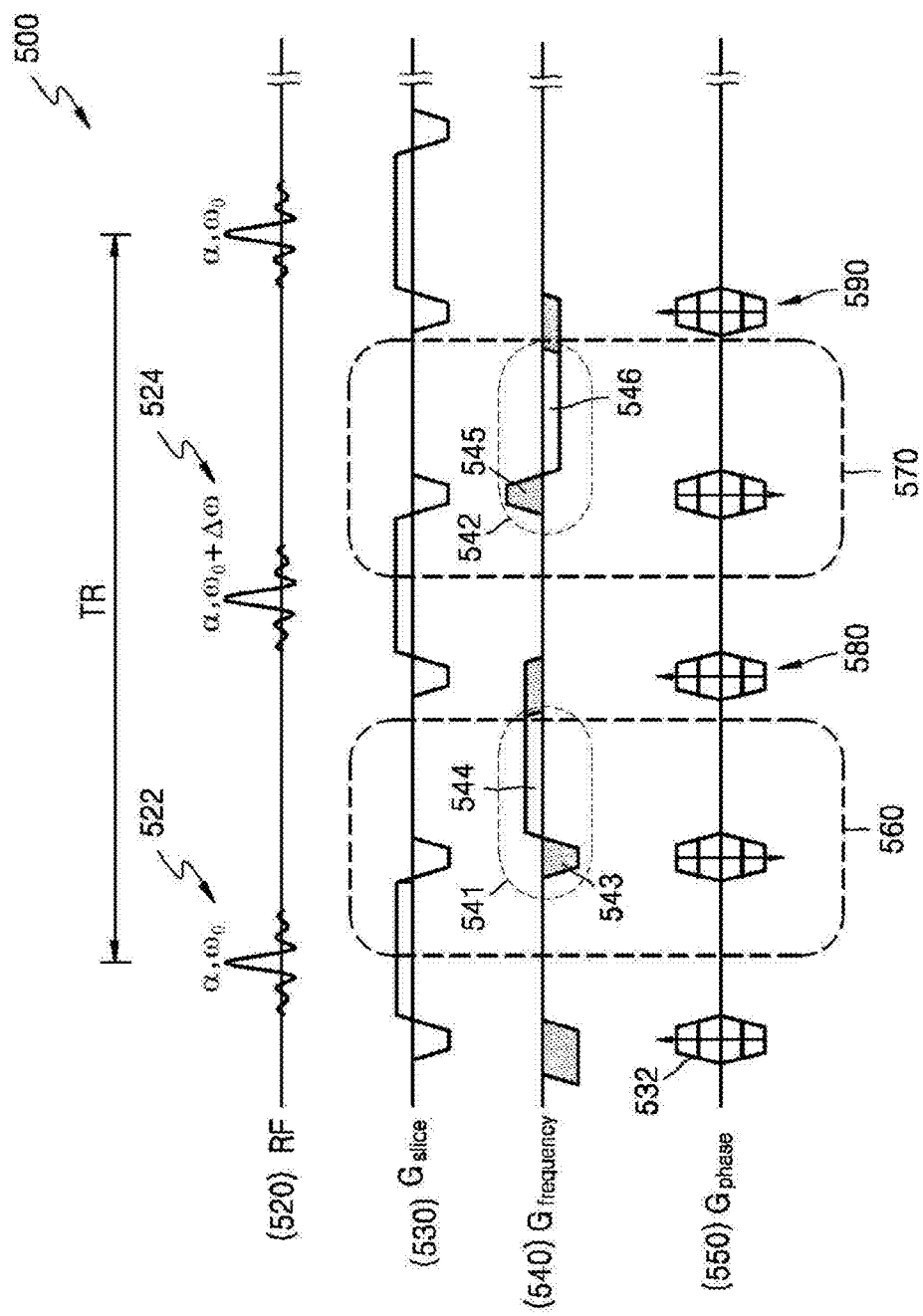
FIG. 5 is a sequence schematic diagram, according to an exemplary embodiment.

FIG. 5 is a sequence schematic diagram, according to an exemplary embodiment.

Referring to FIG. 5, the MRI apparatus 200 may control an RF pulse sequence 520, a slice selection gradient $G_{slice}$ 530, a frequency encoding gradient $G_{frequency}$ 540, and a phase encoding gradient $G_{phase}$ 550, based on a SSFP sequence.

In this aspect, a SSFP sequence is a sequence used in a technique for obtaining an MR image by using a steady state, and may include a technique for adjusting the frequency encoding gradient $G_{frequency}$ 540 and the phase encoding gradient $G_{phase}$ 550 in order to refocus a dephased MR signal after an RF pulse is transmitted. According to an exemplary embodiment, the MRI apparatus 200 may apply a plurality of RF pulses, i.e., first and second RF pulses 522 and 524, to an object during one repetition time TR based on a SSFP technique.

In detail, according to an exemplary embodiment, the MRI apparatus 200 may apply the first and second RF pulses 522 and 524 which respectively correspond to the first and second slices 410 and 420 shown in FIG. 4 to the object.

Furthermore, the MRI apparatus 200 may apply the first and second spatial encoding gradients 560 and 570 for respectively acquiring spatial information of the first and second slices 410 and 420.

According to an exemplary embodiment, the MRI apparatus 200 may control frequency encoding gradients 541 and 542 respectively in the first spatial encoding gradient 560 which corresponds to the first slice 410 and the second spatial encoding gradient 570 which corresponds to the second slice 420 to have opposite polarities with respect to each other.

In detail, referring to FIG. 5, when the frequency encoding gradient 541 in the first spatial encoding gradient 560 includes a negative pulse 543 and a positive pulse 544, the frequency encoding gradient 542 in the second spatial encoding gradient 570 which corresponds to the second slice 420 may include a positive pulse 545 and a negative pulse 546.

As described above, by controlling the frequency encoding gradients 541 and 542 respectively in the first and second spatial encoding gradients 560 and 570 to have opposite polarities with respect to each other, the sum of moments of gradients applied to the object during each repetition time TR may be adjusted to be zero (i.e., 0) or approximately zero. Furthermore, the MRI apparatus 200 may control a magnitude of the frequency encoding gradient $G_{frequency}$ 540 applied to the object.

Figure 6:
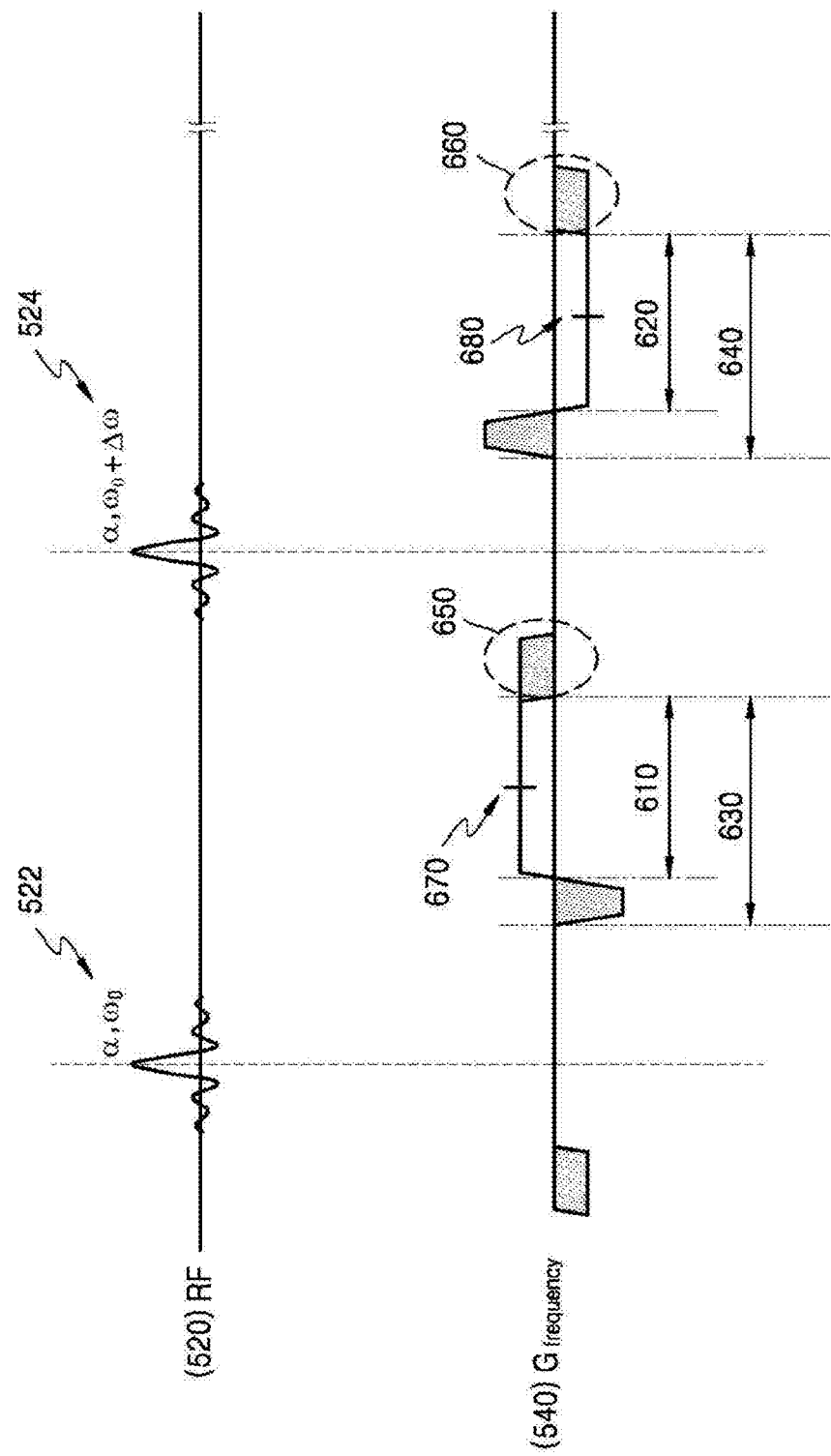
FIG. 6 is detailed diagram showing a frequency encoding gradient in a pulse sequence schematic diagram, according to an exemplary embodiment.

FIG. 6 is detailed diagram showing the frequency encoding gradient $G_{frequency}$ 540 in the pulse sequence schematic diagram 500, according to an exemplary embodiment.

Referring to FIG. 6, after applying the first RF pulse 522 or the second RF pulse 524, the MRI apparatus 200 may apply the frequency encoding gradient $G_{frequency}$ 540 to the object in order to acquire spatial information in the X-direction. Furthermore, the MRI apparatus 200 may apply gradients that respectively include readout intervals 610 and 620 during which MR signals are acquired in a frequency encoding direction.

According to an exemplary embodiment, the MRI apparatus 200 may apply a first bipolar gradient 630 and a second bipolar gradient 640 in the frequency encoding direction in order to intentionally rephase dephased MR signals. Furthermore, the first and second bipolar gradients 630 and 640 may each include pulses with opposite polarities. In this case, a negative pulse of the first bipolar gradient 630 may have the same magnitude as a positive pulse of the second bipolar gradient 640, and a positive pulse of the first bipolar gradient 630 may have the same magnitude as a negative pulse of the second bipolar gradient 640. Furthermore, the negative pulse in the first bipolar gradient 630 may have half the magnitude of the positive pulse therein. Thus, the MRI apparatus 200 may acquire MR signals that have the greatest magnitude at centers 670 and 680 of periods during which the positive pulse of the first bipolar gradient 630 and the negative pulse of the second bipolar gradient 640 are respectively applied.

According to an exemplary embodiment, the MRI apparatus 200 may control a magnitude of a gradient applied in a frequency encoding direction. For example, after applying the first and second bipolar gradients 630 and 640, the MRI apparatus 200 may further apply first and second extra gradients 650 and 660, respectively. In this case, the first and second extra gradients 650 and 660 may be spoiler gradients. A spoiler gradient is applied to an object in order to eliminate transverse magnetization in a steady state. The spoiler gradient is used to prevent a FID signal emitted from a second slice from interference which could be caused by an echo signal emitted from a first slice.

Referring back to FIG. 5, after applying the first and second spatial encoding gradients 560 and 570, the MRI apparatus 200 may apply rewinder gradients to the object. A rewinder gradient is a gradient applied in a phase direction to refocus an MR signal dephased by the spatial encoding gradients, and may have an opposite polarity to that of a spatial encoding gradient applied in a phase direction. For example, if a spatial encoding gradient of +3 is applied in a phase direction, the MRI apparatus 200 may apply a rewinder gradient of −3. Referring back to FIG. 4, the MRI apparatus 200 may acquire MR signals during the readout intervals 610 and 620 in the sequence schematic diagram 500 of FIGS. 5 and 6 during one repetition time TR.

Furthermore, the MRI apparatus 200 may generate an MR image by using the acquired MR signals.

Figure 7:
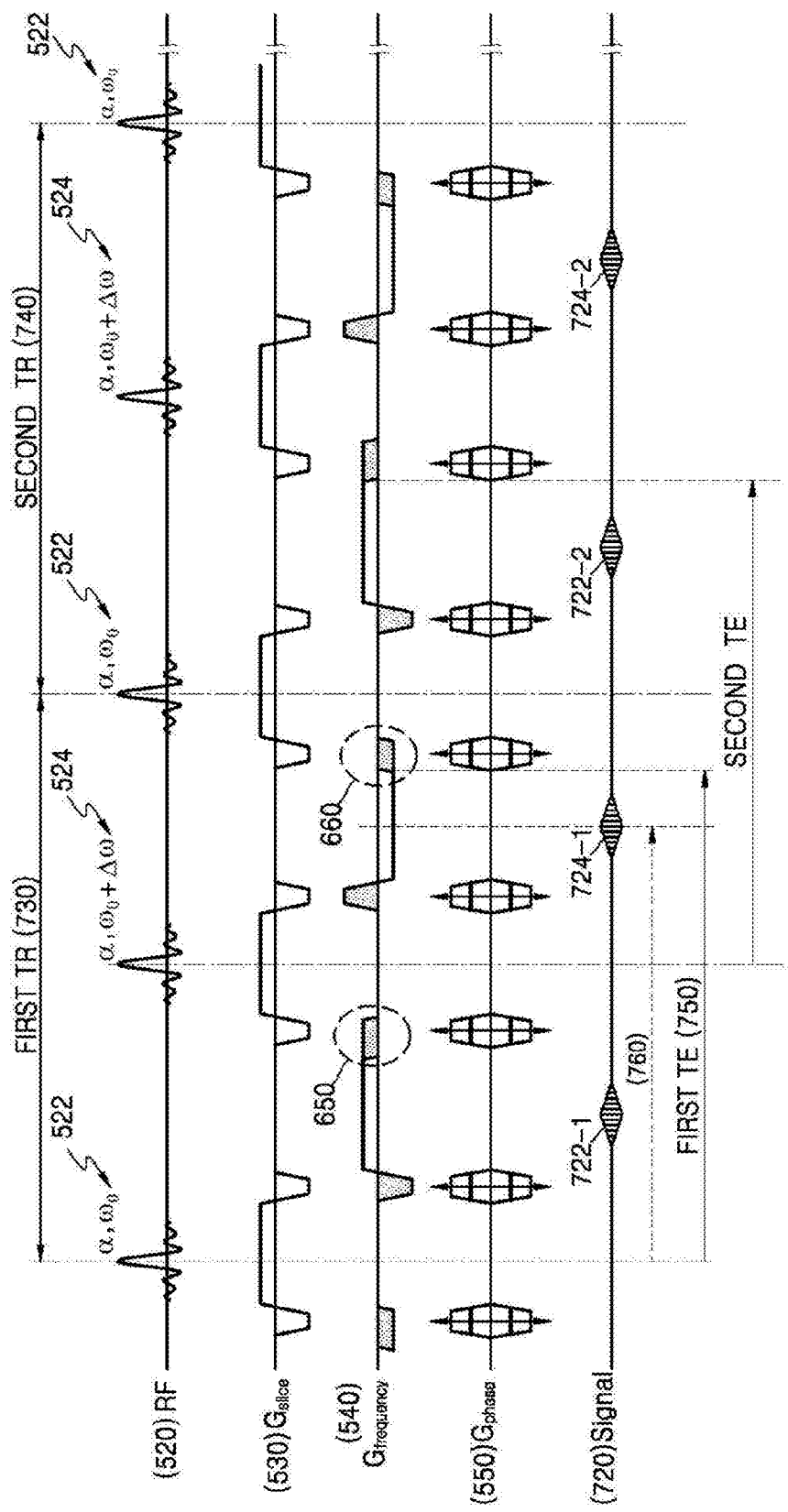
FIG. 7 is a detailed diagram of an MR signal acquired from an object based on a sequence schematic diagram, according to an exemplary embodiment.

FIG. 7 is a detailed diagram of an MR signal acquired from an object based on the sequence schematic diagram 500, according to an exemplary embodiment.

Referring to FIG. 7, the MRI apparatus 200 may acquire MR signals which include FID signals 720 and echo signals that respectively correspond to the first and second slices (410 and 420 of FIG. 4) during a first repetition time TR 730.

In detail, the MRI apparatus 200 may sequentially acquire a first FID signal 722-1 that corresponds to the first slice 410 and a second FID signal 724-1 that corresponds to the second slice 420 during a plurality of readout intervals within a first repetition time TR 730.

Furthermore, the MRI apparatus 200 may acquire an echo signal that corresponds to the first or second slice 410 or 420 after a lapse of time to echo (TE) from application of a first or second RF pulse 522 or 524 during the first repetition time TR 730.

For example, as shown in FIG. 7, an echo signal emitted from the first slice 410 may be acquired at a time point that is a first time to echo TE after application of the first RF pulse.

As described above with reference to FIG. 6, according to an exemplary embodiment, when the first and second extra gradients 650 and 660 are not applied in a frequency encoding direction, the first time to echo TE may be shortened. However, in this case, an echo signal acquired from the first slice 410 and the second FID signal 724-1 acquired from the second slice 420 may overlap each other. Thus, application of the first and second extra gradients 650 and 660 in the frequency encoding direction according to an exemplary embodiment may prevent interference occurring due to echo signals acquired from the first and second slices 410 and 420. In detail, when the first and second extra gradients 650 and 660 are applied, the first time to echo TE is increased from a first time interval 760 to a second time interval 750, as shown in FIG. 7. Since the time at which an echo signal is generated is delayed accordingly, it is possible to prevent interference occurring due to echo signals acquired from the first and second slices 410 and 420.

In addition, the time to echo TE may be a period from the time when one RF pulse is applied to an object to the time when the sum of moments of gradients is equal to a preset value. For example, the TE may be a time interval from the time an RF pulse is applied to the object to the time the sum of moments of gradients becomes equal to zero or approximates zero.

Referring to FIG. 7, the MRI apparatus 200 may repeatedly apply, to the object, first and second RF pulses 522 and 524 which respectively correspond to the first and second slices 410 and 422 during a second repetition time TR 740. Furthermore, the MRI apparatus 200 may acquire third and fourth FID signals 722-2 and 722-4 after respectively applying the first and second RF pulses 522 and 524. In this case, the third and fourth FID signals 722-2 and 724-2 may include spatial information in a phase direction that is different from corresponding spatial information in the first and second FID signals 722-1 and 724-1.

Figure 8:
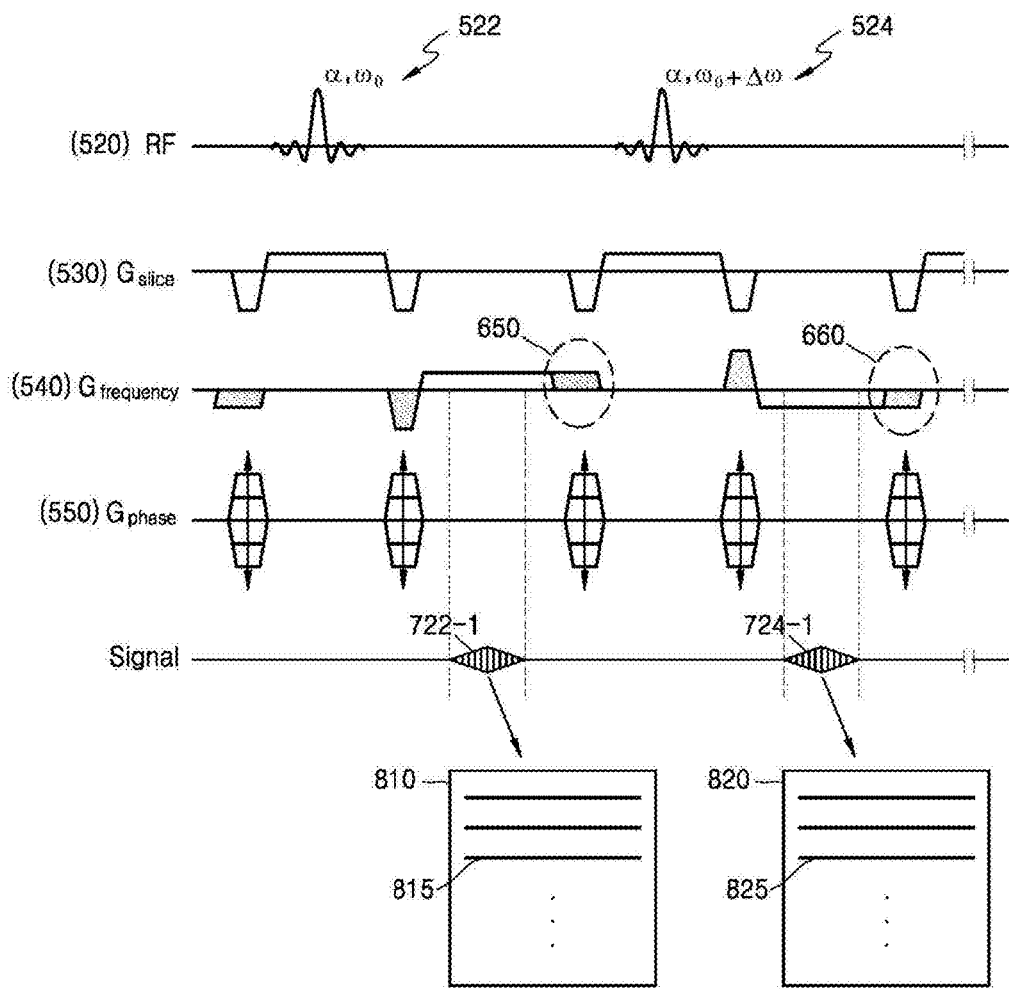
FIG. 8 is a diagram for explaining a method of generating k space data via an MRI apparatus, according to an exemplary embodiment.

FIG. 8 is a diagram for explaining a method of generating k-space data via the MRI apparatus 200, according to an exemplary embodiment.

Referring to FIG. 8, the MRI apparatus 200 may generate data in a first K-space 810 that corresponds to the first slice (410 of FIG. 4) and data in a second K-space 820 that corresponds to the second slice (420 of FIG. 4) by sequentially sampling or undersampling acquired MR signals. For example, the MRI apparatus 200 may acquire line data 815 in the first K-space 810, followed by acquisition of line data 825 in the second K-space 820.

Furthermore, the MRI apparatus 200 may generate a first MR image based on the line data 815 filled in the first K space 810. Similarly, the MRI apparatus 200 may generate a second MR image based on the line data 825 filled in the second K space 820.

In this way, the first and second MR images that respectively correspond to the first and second slices 410 and 420 may be generated based on RF pulses repeatedly applied to the object at relatively short time intervals (e.g., every 2.0 ms). Thus, the MRI apparatus 200 may reduce image distortions due to motion of the object that occurs during generation of an MR image, or obtain a navigator image, by using the first and second MR images.

Figure 9:
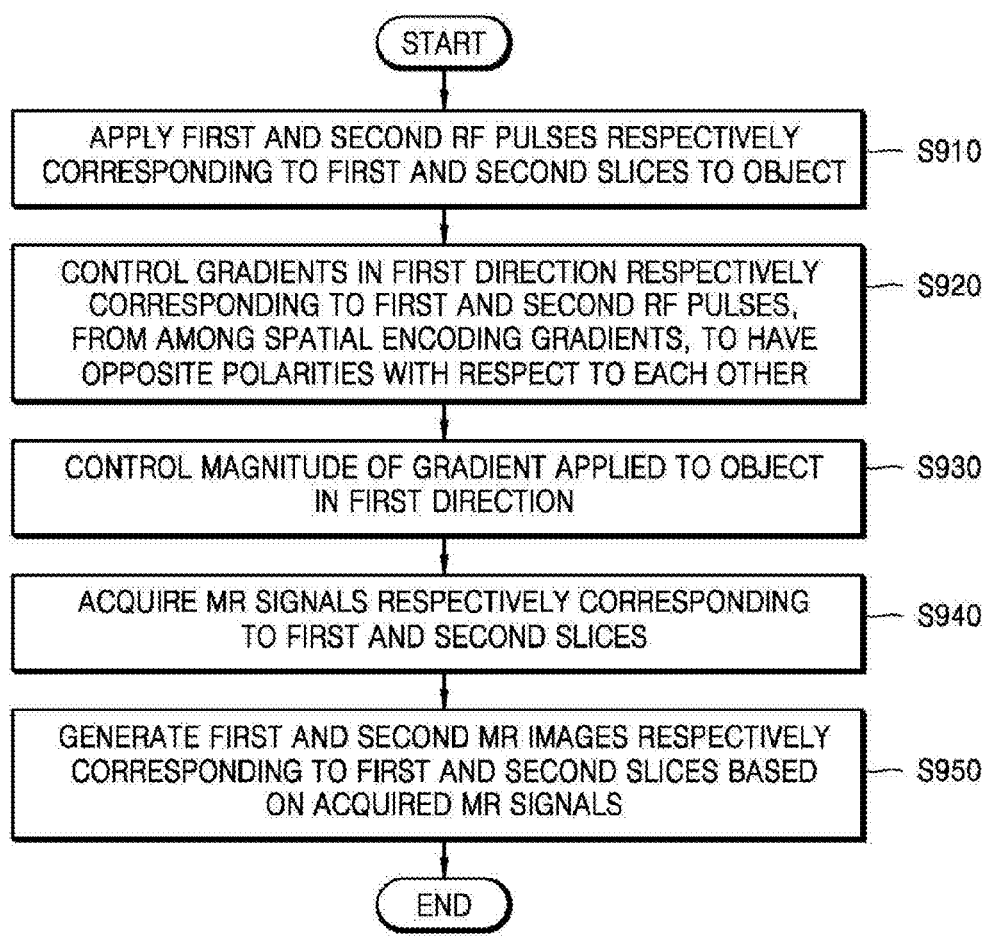
FIG. 9 is a flowchart of a method for generating an MR image via an MRI apparatus based on a steady state free precession (SSFP) sequence, according to an exemplary embodiment.

FIG. 9 is a flowchart of a method for generating an MR image via the MRI apparatus 200 based on a SSFP sequence, according to an exemplary embodiment.

In this case, a SSFP sequence is a technique for obtaining an MR image by using a steady state and may include a gradient sequence for refocusing a dephased MR signal after an RF pulse is transmitted. Furthermore, the steady state may be a state in which transverse magnetization of spins of atomic nuclei to which electromagnetic waves have been applied does not completely decay but partially remains.

Referring to FIG. 9, in operation S910, the MRI apparatus 200 may apply first and second RF pulses that respectively correspond to first and second slices to the object. In this aspect, a slice may be a unit region of the object from which an MR signal is acquired in order to generate an MR image.

In operation S920, the MRI apparatus 200 may control gradients in a first direction that respectively correspond to first and second RF pulses, from among spatial encoding gradients, to have opposite polarities with respect to each other. In this aspect, a gradient in the first direction may be one of the spatial encoding gradients, which is applied to the object in the first direction. According to an exemplary embodiment, the first direction may be a direction in which a frequency encoding gradient is applied.

When the spatial encoding gradients are applied to the object so that different resonant frequencies may be induced according to regions of the object, the MRI apparatus 200 may obtain location information of each of the regions of the object. The spatial encoding gradients may include gradients in X-axis, Y-axis, and Z-axis directions. In detail, the spatial encoding gradients may be represented in a 3D K-space, and the gradients in X-axis, Y-axis, and Z-axis directions may respectively correspond to gradients along Kx, Ky, and Kz axes. According to an exemplary embodiment, the gradients in X-axis, Y-axis, and Z-axis directions may respectively correspond to a frequency encoding gradient, a phase encoding gradient, and a slice selection gradient. According to an exemplary embodiment, a gradient in a frequency encoding direction may correspond to a gradient in a Y-axis direction of K-space, i.e., a Ky-axis direction.

According to an exemplary embodiment, the MRI apparatus 200 may sequentially apply first and second spatial encoding gradients that respectively correspond to the first and second RF pulses. Furthermore, the MRI apparatus 200 may control gradients in the first direction that respectively correspond to first and second RF pulses to have opposite polarities with respect to each other.

According to an exemplary embodiment, gradients in the first direction that respectively correspond to the first and second RF pulses may be bipolar gradients. For example, a gradient in the first direction that corresponds to each RF pulse may be a bipolar gradient that includes a pre-phasing gradient. If a gradient in the first direction that corresponds to the first RF pulse sequentially has first and second polarities (or second and first polarities), a gradient in the first direction that corresponds to the second RF pulse may sequentially have second and first polarities (or first and second polarities).

Furthermore, to refocus a residual transverse magnetization of spins of atomic nuclei that does not completely decay based on a SSFP sequence, the MRI apparatus 200 may control gradients applied to an object in a second direction from among first and second spatial encoding gradients (i.e., gradients in the second direction) to have opposite directions with respect to each other. In this case, the second direction may be a phase encoding direction.

In this manner, by applying gradients in the first and second directions and having opposite polarities during one repetition time TR, the MRI apparatus 200 may control the sum of moments of gradients applied to the object during one repetition time TR to be constant. For example, the MRI apparatus 200 may control the sum of moments of gradients applied to the object during each repetition time TR to be equal to zero (i.e., 0) or approximately zero. Thus, the MRI apparatus 200 may apply a gradient sequence to the object according to a SSFP or balanced SSFP (bSSFP) technique.

In operation S930, the MRI apparatus 200 may control a magnitude of the gradient applied to the object in the first direction. For example, after applying the first gradient in the first direction in correspondence with the first slice, the MRI apparatus 200 may apply a first extra gradient (i.e., a third gradient) in the first direction. Furthermore, after applying the second gradient in the first direction in correspondence with the second slice, the MRI apparatus 200 may apply a second extra gradient (i.e., a fourth gradient) in the first direction. In this case, the first and second extra gradients, which respectively correspond to the first and second slices, are applied in order to avoid interference between MR signals from different slices. In addition, since the first and second extra gradients have opposite polarities with respect to each other, the sum of moments of gradients applied to the object during one repetition time TR may be kept constant.

In operation S940, the MRI apparatus 200 may acquire MR signals that respectively correspond to the first and second slices.

According to an exemplary embodiment, the MRI apparatus 200 may apply different RF pulses that respectively correspond to the plurality of slices during the one repetition time TR, and sequentially acquire MR signals that respectively correspond to the different RF pulses during the same period.

In this case, MR signals acquired by the MRI apparatus 200 may include a FID signal and an echo signal. For example, the MRI apparatus 200 may sequentially receive a first FID signal emitted from the first slice and a second FID signal emitted from the second slice during one repetition time TR. Furthermore, after receiving a first FID signal emitted from the second slice, the MRI apparatus 200 may acquire an echo signal emitted from the first slice. When a gradient is applied based on a SSFP sequence, echo signals may be generated at intervals of time to echo TE that is equal or close to repetition time TR. For example, an echo signal from the first slice and an FID signal from the second slice may overlap each other.

According to an exemplary embodiment, the gradient magnetic field controller 220 may apply first and second extra gradients in the first direction to the object, thereby preventing interference between the echo signal from the first slice and the FID signal from the second slice.

In operation S950, the MRI apparatus 200 may generate, based on the acquired MR signals, first and second MR images that respectively correspond to the first and second slices.

The MRI apparatus 200 may generate K-space data by sampling an acquired MR signal. Furthermore, the MRI apparatus 200 may generate an MR image by performing a Fourier transform by which the K-space data is converted from the frequency domain to the spatial domain.

According to an exemplary embodiment, the MRI apparatus 200 may generate first K-space data that corresponds to a first slice and second K-space data that corresponds to a second slice by sequentially sampling a first MR signal that includes spatial information of the first slice and a second MR signal that includes spatial information of the second slice. Furthermore, the image processor 240 may generate first and second MR images that respectively correspond to the first and second slices based on the first and second K-space data.

Alternatively, the MRI apparatus 200 may generate K-space data by undersampling an acquired MR signal. In this case, the MRI apparatus 200 may generate a respective MR image that corresponds to each slice based on undersampled K-space data by using GRAPPA, SENSE, and/or any other suitable technique.

According to an exemplary embodiment, the MRI apparatus 200 may correct K-space data based on a magnetic field distribution of a coil included in the MRI apparatus 200 in order to compensate for banding artifacts that may occur due to the use of a SSFP sequence.

As described above, according to an exemplary embodiment, the MRI apparatus 200 may generate a plurality of MR images that respectively correspond to a plurality of slices based on a SSFP sequence in an interleaved manner.

Figure 10:
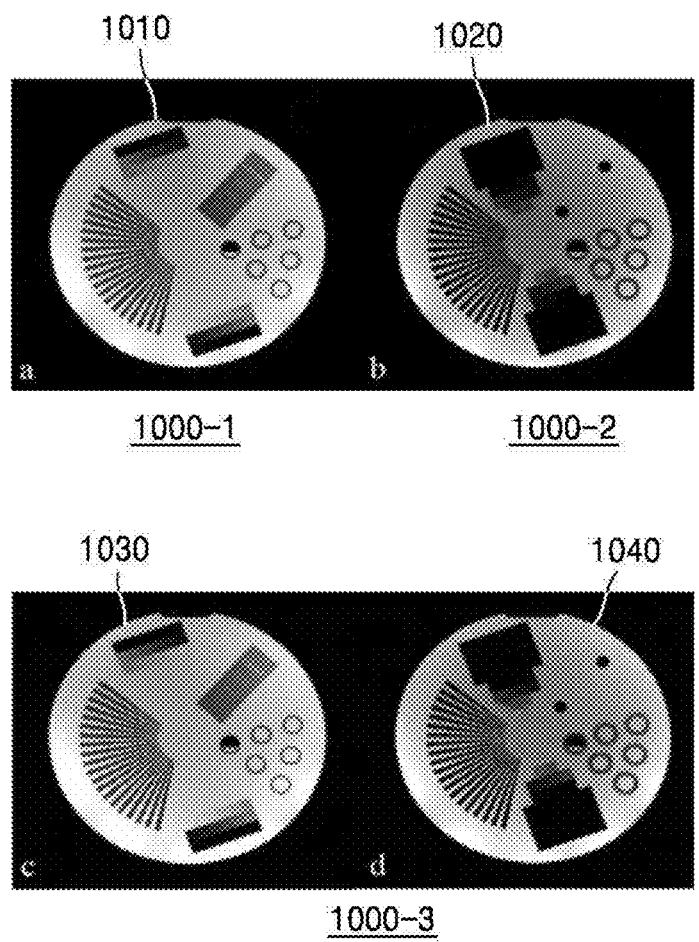
FIG. 10 is an example in which an MRI apparatus generates MR images by using a resolution phantom.

FIG. 10 is an example in which the MRI apparatus 200 generates MR images by using a resolution phantom.

Referring to FIG. 10, drawing 1000-1 shows an MR image 1010 generated by the MRI apparatus 200 based on an MR signal that is acquired by applying only a first RF pulse that corresponds to a first slice. Furthermore, drawing 1000-2 shows an MR image 1020 generated by the MRI apparatus 200 based on an MR signal that is acquired by applying only a second RF pulse that corresponds to a second slice.

Drawing 1000-3 shows MR images 1030 and 1040 generated by the MRI apparatus 200 based on MR signals that are acquired by sequentially applying first and second RF pulses that respectively correspond to first and second slices during one repetition time TR, according to an exemplary embodiment.

Figure 11:
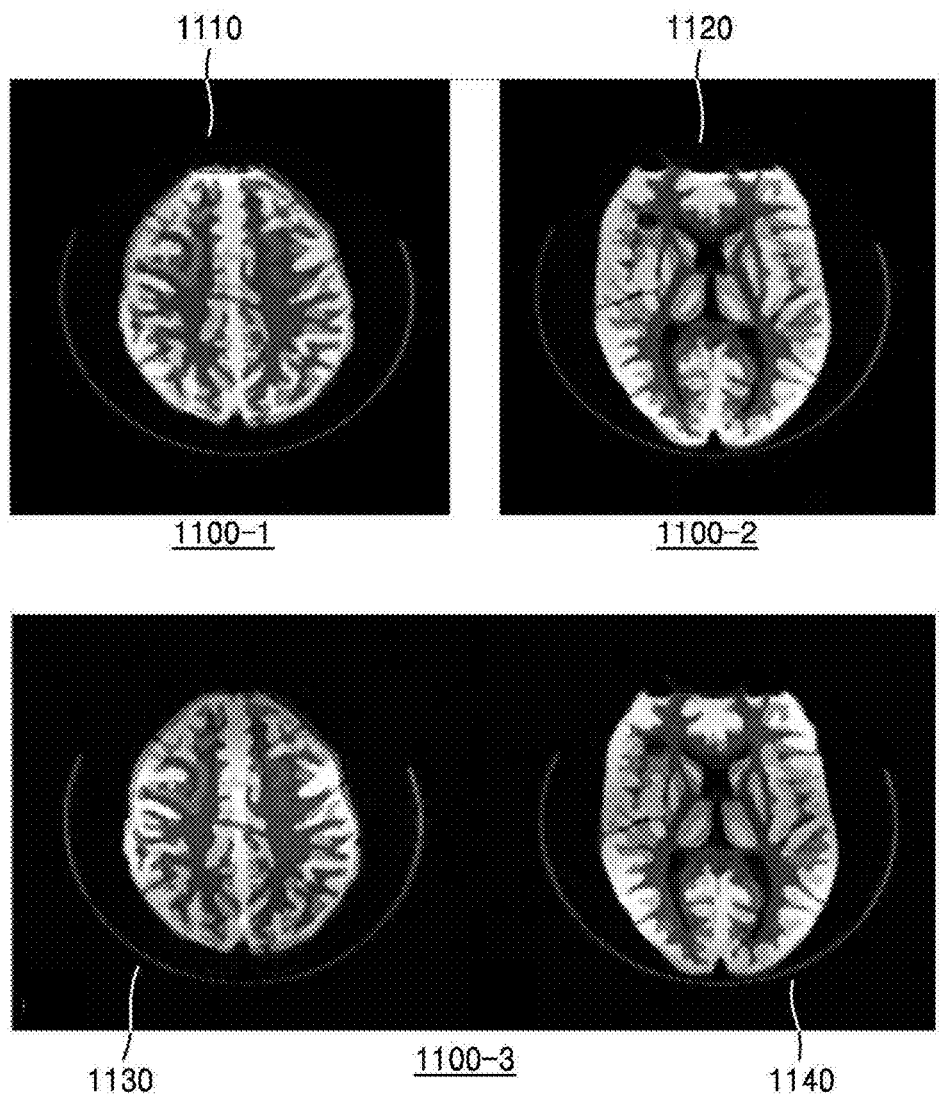
FIG. 11 is an example in which an MRI apparatus generates MR images by using a brain phantom.

FIG. 11 is an example in which the MRI apparatus 200 generates MR images by using a brain phantom.

Referring to FIG. 11, drawings 1100-1 and 1100-2 show MR images 1110 and 1120 generated by the MRI apparatus 200 based on MR signals that are acquired by applying only RF pulses that respectively correspond to one single slice (i.e., a first slice or a second slice).

Drawing 1103 shows MR images 1130 and 1140 generated by the MRI apparatus 200 based on MR signals that are acquired by sequentially applying first and second RF pulses that respectively correspond to the first and second slices during one repetition time TR, according to an exemplary embodiment.

As is apparent from experimental results using phantoms in FIGS. 10 and 11, a plurality of MR images (as shown in drawing 1000-3 and drawing 1100-3) that are generated together by the MRI apparatus 200, according to an exemplary embodiment, may exhibit a relatively high signal to noise ratio (SNR) and a relatively high contrast-to-noise ratio (CNR), as compared with a single MR image (as shown in drawing 1000-1 and drawing 1000-2 or drawing 1100-1 and drawing 1100-2) generated by the MRI apparatus 200.

Figure 12A:
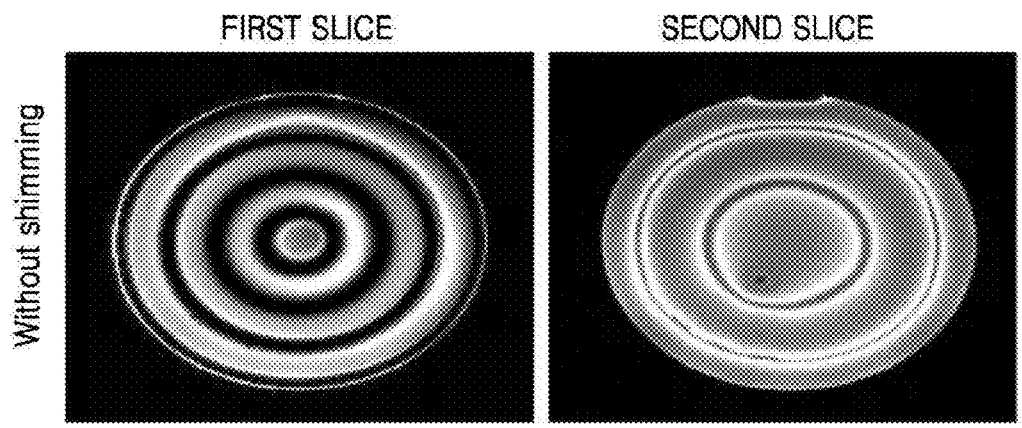
FIGS. 12A, 12B, and 12C illustrate examples of banding artifacts present in MR images generated by an MRI apparatus.
Figure 12B:
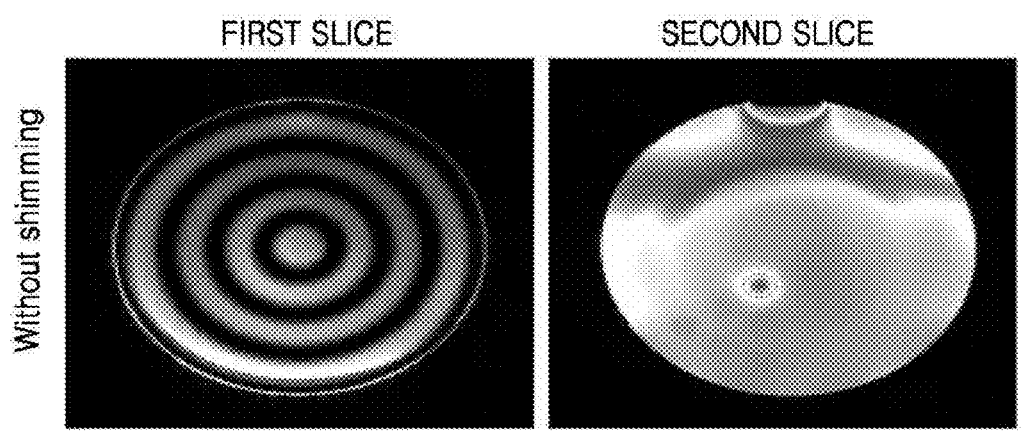
Figure 12C:
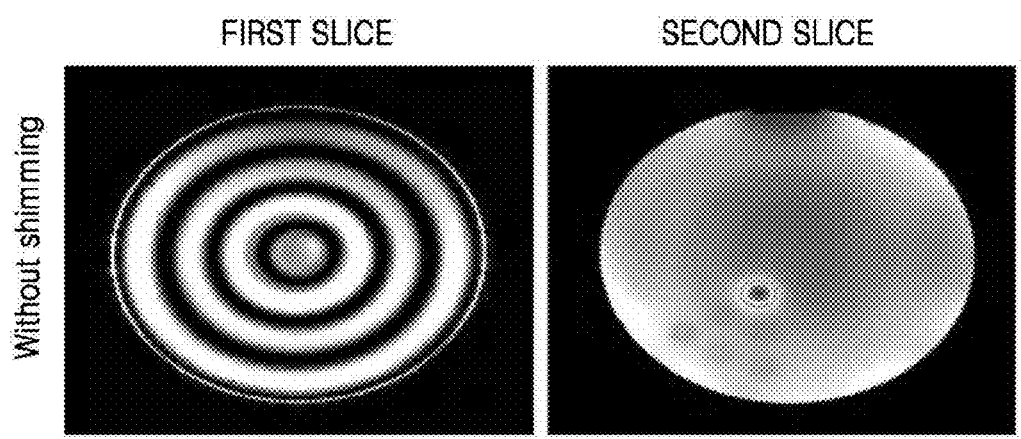

FIGS. 12A, 12B, and 12C illustrate examples of banding artifacts present in MR images generated by the MRI apparatus 200.

Referring to FIG. 12A, the MRI apparatus 200 may generate an MR image containing banding artifacts.

According to an exemplary embodiment, the MRI apparatus 200 may reduce banding artifacts in an MR image based on a magnetic field distribution of a coil included therein. In detail, as shown in FIGS. 12B and 12C, the MRI apparatus 200 may reduce banding artifacts in an MR image via the use of a shimming coil.

The exemplary embodiments of the present inventive concept can be written as computer programs and can be implemented in general-use digital computers that execute the programs using a non-transitory computer-readable recording medium.

Examples of the non-transitory computer-readable recording medium include magnetic storage media (e.g., ROM, floppy disks, hard disks, etc.), optical recording media (e.g., CD-ROMs or DVDs), etc.

While the present inventive concept has been particularly shown and described with reference to exemplary embodiments thereof, it will be understood by persons having ordinary skill in the art that various changes in form and details may be made therein without departing from the spirit and scope of the present inventive concept as defined by the following claims. Accordingly, the above exemplary embodiments and all aspects thereof are examples only and are not limiting.

What is claimed is:

1. A magnetic resonance imaging (MRI) apparatus for generating an MR image based on a steady state free precession (SSFP) sequence, the MRI apparatus comprising:
    a radio frequency (RF) controller configured to apply, to an object, a first RF pulse that corresponds to a first slice and a second RF pulse that corresponds to a second slice;
    a gradient magnetic field controller configured to control a first gradient magnetic field in a first direction in correspondence with the first RF pulse and a second gradient magnetic field in the first direction in correspondence with the second RF pulse, from among spatial encoding gradients, to have opposite polarities with respect to each other;
    a data acquirer configured to acquire a first MR signal that corresponds to the first slice and a second MR signal that corresponds to the second slice; and
    an image processor configured to generate a first MR image that corresponds to the first slice based on the acquired first MR signal, and to generate a second MR image that corresponds to the second slice based on the acquired second MR signal.

2. The MRI apparatus of claim 1, wherein the spatial encoding gradients include a slice selection gradient, a frequency encoding gradient, and a phase encoding gradient, and
    wherein the frequency encoding gradient is applied in the first direction.

3. The MRI apparatus of claim 1, wherein each of the first gradient magnetic field and the second gradient magnetic field is a bipolar gradient magnetic that has a first polarity and a second polarity, and
    wherein the gradient magnetic field controller is further configured to control, when the first gradient magnetic field sequentially has the first and second polarities, the second gradient magnetic field to sequentially have the second and first polarities.

4. The MRI apparatus of claim 1, wherein the gradient magnetic field controller is further configured to control a respective magnitude of each of the first gradient magnetic field and the second gradient magnetic field.

5. The MRI apparatus of claim 4, wherein the gradient magnetic field controller is further configured to apply a third gradient magnetic field after applying the first gradient magnetic field, and to apply a fourth gradient magnetic field after applying the second gradient magnetic field.

6. The MRI apparatus of claim 5, wherein the data acquirer is further configured to acquire the first MR signal while the first gradient magnetic field is being applied and to acquire the second MR signal while the second gradient magnetic field is being applied.

7. The MRI apparatus of claim 6, wherein the image processor is further configured to correct each of the first MR signal and the second MR signal based on a magnetic field distribution of a coil included in the MRI apparatus.

8. The MRI apparatus of claim 1, wherein the gradient magnetic field controller is further configured to control a sum of moments of gradient magnetic fields applied during a repetition time TR to be equal to a preset value.

9. A method for generating a magnetic resonance (MR) image based on a steady state free precession (SSFP) sequence via a magnetic resonance imaging (MRI) apparatus, the method comprising:
    applying, to an object, a first radio frequency (RF) pulse that corresponds to a first slice and a second RF pulse that corresponds to a second slice;
    controlling a first gradient magnetic field in a first direction in correspondence with the first RF pulse and a second gradient magnetic field in the first direction in correspondence with the second RF pulse, from among spatial encoding gradients, to have opposite polarities with respect to each other;
    acquiring a first MR signal that corresponds to the first slice and a second MR signal that corresponds to the second slice; and
    generating a first MR image that corresponds to the first slice based on the acquired first MR signal and a second MR image that corresponds to the second slice based on the acquired second MR signal.

10. The method of claim 9, wherein the spatial encoding gradients include a slice selection gradient, a frequency encoding gradient, and a phase encoding gradient, and
    wherein the frequency encoding gradient is applied in the first direction.

11. The method of claim 9, wherein each of the first and second gradient magnetic fields is a bipolar gradient magnetic field that has a positive and polarity and a negative polarity, and
    wherein the controlling the first and second gradient magnetic fields to have opposite polarities comprises controlling the first and second gradient magnetic fields to sequentially have the opposite polarities.

12. The method of claim 9, further comprising controlling a respective magnitude of each of the first gradient magnetic field and the second gradient magnetic field.

13. The method of claim 12, wherein the controlling of the respective magnitude of each of the first gradient magnetic field and the second gradient magnetic field comprises:

applying a third gradient magnetic field after applying the first gradient magnetic field; and applying a fourth gradient magnetic field after applying the second gradient magnetic field.

14. The method of claim 9, wherein the acquiring the first and second MR signals comprises:

acquiring the first MR signal while the first gradient magnetic field is being applied; and acquiring the second MR signal while the second gradient magnetic field is being applied.

15. The method of claim 14, wherein the generating the first and second MR images comprises correcting each of the first MR signal and the second MR signal based on a magnetic field distribution of a coil included in the MRI apparatus.

16. The method of claim 9, further comprising controlling a sum of moments of gradients applied during a repetition time TR to be equal to a preset value.

17. A non-transitory computer-readable recording medium having recorded thereon a program for executing the method of claim 9 on a computer.

* * * * *